United States Patent [19]

Feuerbaum

[11] 4,169,229
[45] Sep. 25, 1979

[54] APPARATUS FOR KEYING IN ELECTRON BEAMS

[75] Inventor: Hans-Peter Feuerbaum, Munich, Fed. Rep. of Germany

[73] Assignee: Siemens Aktiengesellschaft, Berlin & Munich, Fed. Rep. of Germany

[21] Appl. No.: 932,668

[22] Filed: Aug. 10, 1978

[30] Foreign Application Priority Data

Sep. 26, 1977 [DE] Fed. Rep. of Germany ....... 2743200

[51] Int. Cl.$^2$ ............................................. G21K 1/08
[52] U.S. Cl. ................................. 250/396 R; 250/311
[58] Field of Search ......................... 250/396, 397, 311

[56] References Cited

PUBLICATIONS

"A New Type of Traveling Wave Deflection System" by Yamada et al., IEEE Trans. on Electron Devices, vol. ED-19, No. 2, Feb. 1972, pp. 204-213.

*Primary Examiner*—Harold A. Dixon

*Attorney, Agent, or Firm*—Hill, Van Santen, Steadman, Chiara & Simpson

[57] ABSTRACT

In an illustrative embodiment an electron beam is keyed into an operative scanning path through a small aperture by applying keying signals of opposite polarity to respective symmetrically arranged meander conductors. The keying signals produce respective traveling waves which periodically come into proximity to the beam electrons (in synchronism with beam velocity) at successive points along the beam path. The opposite potentials of the meander conductors except during keying operations produce transverse fields at the interaction points which progressively deflect the beam out of its operative path. During key-in, the effective deflection field on a beam electron packet is abruptly decreased in magnitude at each successive interaction point while the symmetrical arrangement of the meander conductors along the beam axis avoids the production of a longitudinal field component which would provide an adverse defocussing effect on the beam electrons.

3 Claims, 5 Drawing Figures

APPARATUS FOR KEYING IN ELECTRON BEAMS

BACKGROUND OF THE INVENTION

The invention relates to an apparatus for keying in electron beams, appropriate for a raster electron scan microscope, an electron beam recording device, and the like. Such apparatus comprises a deflection system for the deflection of the electron beam and controllable as a function of time for deflecting the beam to effect a scanning operation. A velocity modulating effect adapted to the beam velocity is used for controlling deflection.

The use of an electron beam keying apparatus is known from the state of the art in an electron beam system of a raster electron scan microscope. The actual apparatus for keying in the electron beam is a deflection system by which the electron beam is deflected in the regular case between the cathode and the raster deflection field over an aperture lens and/or it is deflected into and out of said aperture lens. Such a deflection system preferably is mounted behind the first anode, that is behind the principal electron beam (viewed from the cathode). Thereby it is at least proximal to the area of the beam focusing.

Moreover, it is a customary practice to carry out with a raster electron scan microscope potential contrast measurements, particularly at integrated circuits of the semiconductor type. It is possible to record with these readings potential courses electron-optically, for example in conductor tracks, whereby a particular interest exists in potential changes at very high frequencies and impulse currents of high frequencies. Because the evaluation of the secondary electron emission utilized with potential contrast measurements with electron beams as such is at least inappropriate for recording very rapid processes, for example with $10^7$ to $10^9$ cycles, true in time, the so-called stroboscope principle has been applied which is known from high frequency measuring techniques under the term "sampling". Thereby a repeated correlated scanning of a desired spot takes place, whose potential contrast is to be determined. This stroboscopic scanning then is repeated at a slight phase shifting, so that, in line with the type of a sampling method the entire, very high-frequency potential course can be determined, although in the measuring direction a relative time carrier effect is involved, namely in connection with the secondary emission and the collection of the secondary electrons.

This stroboscope or sampling method requires the production of extremely short electron beam impulses in the raster electron scan microscope, whose phase then is to be shifted moreover, still in comparison with the AC signal in the sample to be examined. This phase shifting is tantamount with a shifting of the impulse moment of the electron beam.

Such short electron beam impulses are realized according to known practical operation with the use of an aperture lens and such a beam deflection apparatus which basically is provided with two elements, placed opposite each other and extending in the axial direction of an electron beam, and together forming a deflection capacitor, whereby, however, a deflector plate is opposed by an installation which is a traveling wave installation with interdigital structure. In said interdigital structure the wave of the deflecting signal with which this impulse scanning deflecting installation is to be impinged moves at the same speed as the beam electrons passing through this deflecting capacitor. An interdigital structure in the meaning of the invention relates to a finger conduit to be impinged with the signal and interdigitated with a second finger conduit which is grounded.

Additional details can be obtained from the printed publications IEEE Transactions on Electron Devices, volume ED-19, No. 2 (1972), page 204–213 and Scanning Electron Microscopy (1973) (part I), Proc. of the Sixth Annual Electron Microscope Symposium, IIT Research Institute, Chicago, Ill. 60616, USA (April 1973) and Scanning Electron Microscopy (1976) (Part IV) Proc. of the Workshop on Microelectronic Device Fabrication and Quality Control with SEM, IIT Research Institute (April 1976). Such a meander conduit with interdigital structure is shown particularly in FIG. 1 of the article appearing in the first-named printed publication IEEE Transactions on Electron Devices. These cited references also show the manner of operation of a known raster scan electron microscope and/or of the deflection system with traveling wave included in the electron beam system of such a microscope.

One disadvantage of a deflection system known from such prior art consists in that the transverse deflection field in relation to the electron beam axis prevailing between the meander structure and the opposite electrode necessarily also has a longitudinal electrical field component which thus causes an acceleration or retardation of the electron beam. This leads to a defocusing of the electron beam focused as such extremely sharply on the sample to be tested, such defocusing occuring in operation as the electric deflection signal is varied to produce deflection.

SUMMARY OF THE INVENTION

This defocusing effect recognized as a basis of the present invention in devices according to the state of the art, shall be eliminated as a problem in accordance with the teachings of the present invention.

According to the invention this problem is solved in an apparatus as recited in the preamble of claim 1, by the features recited in the characterizing part of claim 1, and further improvements and perfections of the invention are recited in the dependent claims.

The solution according to the invention is based on the idea of providing in the deflection system used as a basis, such measures which will insure that the longitudinal component of the transverse deflection field considered as disadvantageous and undesirable as such will be eliminated. According to the solution offered under the invention this is accomplished by the fact that the deflection installation is of such a symmetrical design that the two deflection parts contained in the deflection system as "deflection plates" are identical with each other and placed symmetrically in relation to each other with reference to the electron beam axis. This measure according to the invention accomplishes that with the supply, likewise according to the invention, of deflection signals with opposite signs, these relations cause at these deflection parts that in the electron beam axis a uniform axial potential prevails, even when the electron beam deflection process starts and is carried out. Under the invention the electron beam continues to be focused sharply upon deflection out of its central position in the opening of the apertured lens.

Additional explanations of the invention become evident from the following description of an embodiment; and other objects, features and advantages will be apparent from this detailed disclosure and from the appended claims.

DETAILED DESCRIPTION

Figure 1:
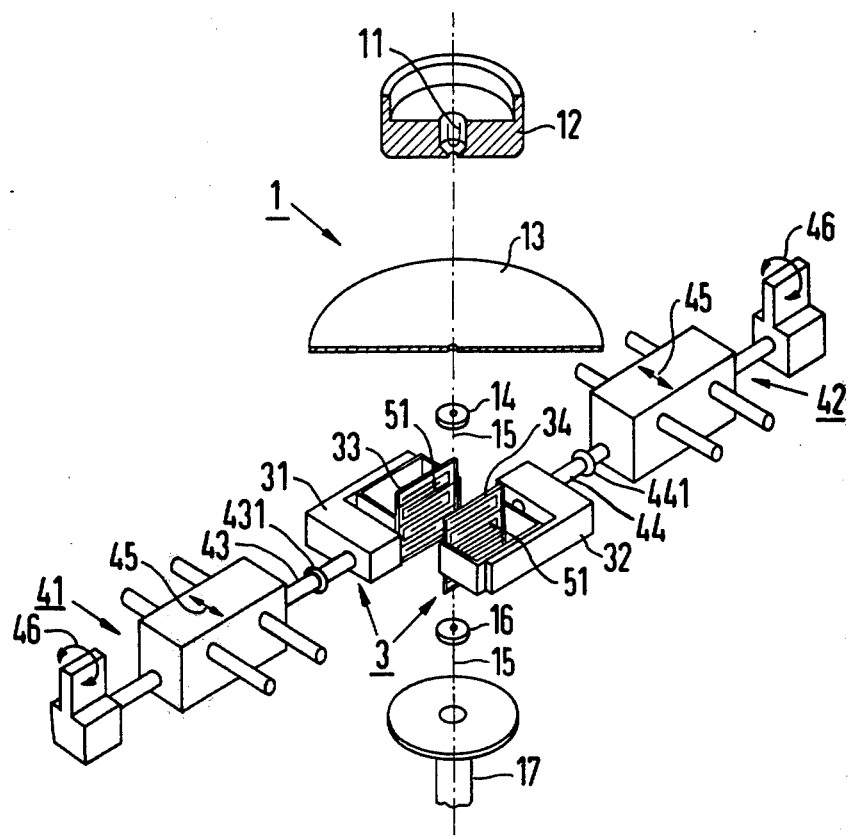
FIG. 1 shows a deflection installation according to the invention in a deflection system.

FIG. 1 represents a deflection installation according to the invention in a deflection system 3 in an electron beam installation 1. Reference numeral 11 identifies the cathode, 12 the Wehnelt electrode and 13 the anode designed as a perforate disk. A first apertured disk lens is identified by 14. It has an aperture of 100 microns in diameter, for example. The electron beam 15 extends from the cathode 11 through the opening in the anode 13 and in the apertured disk lens 14. It continues through the deflection system 3 and in case of no deflection, through a second apertured disk lens 16 having a bore of 300 microns in diameter for example. Then the electron beam 15 enters the interior of a vacuum tube 17 in which it is exposed for example for screen scanning (or raster deflection) to a further deflection installations possibly with the aid of magnetic deflection installations not shown (as known from television tubes). Parts 11 to 16 and the deflection system 3 are all in the interior of a vacuum-tight housing which for the sake of clarity is not represented in FIG. 1.

The deflection installation 3 has two deflection parts 31 and 32 which are the carriers of the deflection plates 33 and 34 as such. For the adjustment of the deflection parts 31 and 32 and thus also of the plates 33 and 34, installations 41 and 42 are provided, with which parts 31 and 32 are connected via shafts 43 and 44. Sealing rings are identified by 431 and 441, which shows that the adjustment systems 41 and 42 are located outside the above mentioned vacuum-tight housing (not shown). As indicated by the double arrows 45 and 46, it is possible to effect with the individual components of the adjustment installations 41 and 42 lateral and angular displacements of the deflection parts 31 and 32 in relation to the beam axis 15 inside the vacuum housing.

Figure 2:
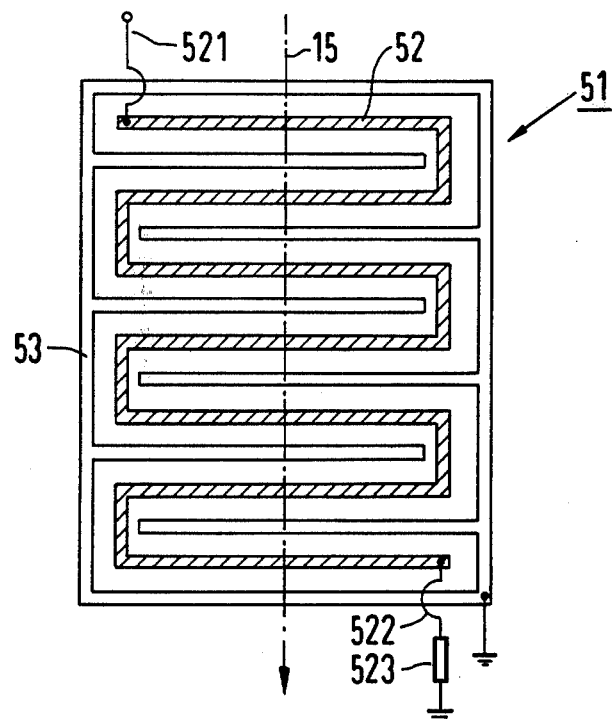
FIG. 2 shows a deflection installation in its details.

The parts 33 and 34 identified above as plates have, as can be seen better from FIG. 2 in a view upon such a plate 33, an interdigital structure 51. It comprises a meander-shaped conductor track 52 and a screening or shielding conductor track 53. As shown schematically, the structure 53 is grounded. The conductor track 52 has a schematically indicated input connection 521 and an output connection 522 likewise grounded via a terminal resistance 523. A high frequency signal entering via the input 521 the conductor track structure 52 moves there according to the meander-shaped path so as to progress in the direction shown by the arrow 15, delayed in accordance with the extension of the path. This manner of operation of an interdigital structure 51 is a matter with which a person skilled in the art is sufficiently familiar, and the arrow 15 in FIG. 2 is identical with the beam axis indicated in FIG. 1 and with the electron beam 15 plotted there. The structure identified by 53 is used with its fingers extending into the meanders of structure 52 to avoid dispersion properties, as this is known as a matter of principle. The dimensioning of an interdigital structure 51 is in a manner known per se from prior art a function of the speed of the beam, that is the acceleration voltage of the electron beam 51 in a manner likewise known from prior art. The interdigital structure 51 may be a conductor track structure designed in a cantilever-like manner or it may be applied to a plate of dielectric material. Both deflection parts 31 and 32 have identical interdigital structures according to the invention at the site of the mentioned plates 33 and 34 so that the respective meander conductive paths 52 are directly in alignment with each other at each point therealong, as indicated in FIG. 1.

Although not shown in FIG. 1 for the sake of clarity, respective deflection signals are fed to the interdigital structures 51 of the respective plates 33 and 34 at the input connections 521 thereof, FIG. 2, said signals being of opposite polarity in the two opposite interdigital structures. This measure, according to the invention, causes that even in the presence of potentials different from zero in the opposite interdigital structures 51, the potential field at the beam axis 15 at least as produced by the signals supplied to the deflection system 3 will not expose the beam to a field component in the longitudinal direction. As a result of the signals on the opposite interdigital structures 51 only transverse fields act upon the electron beam 15, and in fact such signals operate at the same velocity as the velocity of the electron beam 15. The synchronism between electron beam and the deflection signals on the meander path of the conductor track structures 52 causes over the length of the plates 33 and 34 a permanently uniform deflection effect upon the electrons moving synchronously in the electron beam.

After a certain deflection voltage between the opposite interdigital structures 52 the electrons of the electron beam 15 are exposed to such a high deflection that they no longer pass through the aperture of the apertured disk lens 16 and thus they are screened out of the electron beam. The invention assures that electrons which undergo a deflection by which they are not yet screened out at least will not undergo any longitudinal acceleration which could lead to a defocusing at the point of destination which has been determined as disturbing according to the state of the art.

Figure 3:
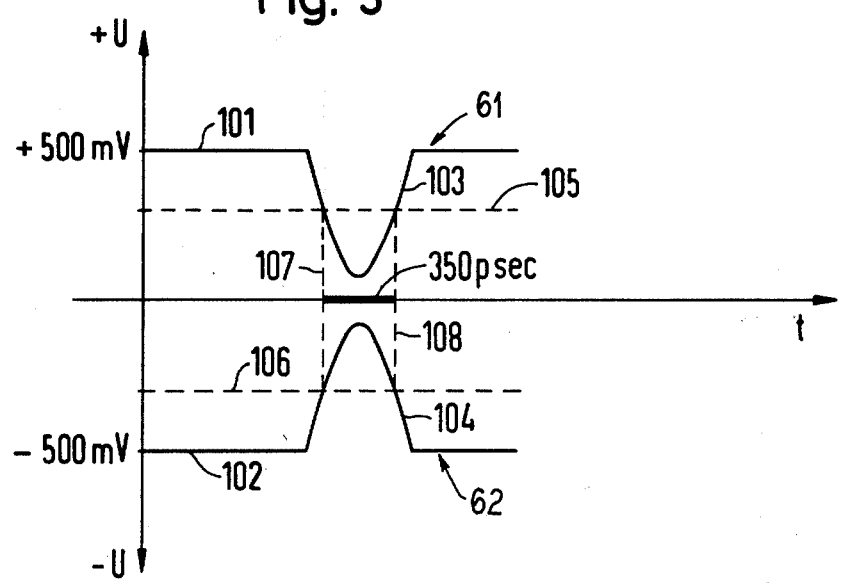
FIG. 3 shows the superposition of the potentials.

FIG. 3 schematically shows in a graph the two signal voltages 61 and 62 to be applied to the prevailing input connections such as 521 of the interdigital structures 51 of both deflection parts 33 and 34 for keying in the beam.

Time is plotted on the abscissa of FIG. 3. On the ordinate the positive potential of one of the interdigital structures 51 is plotted in an upward direction while the negative potential of the opposite other interdigital structure 51 is plotted in a downward direction. Under the keying in of the electron beam contemplated here it is a normal case for the electron beam to be scanned that is deflected in such a manner that it cannot pass through the apertured disk lens 16. Only in keyed-in condition will the electron beam move on the beam axis 15 shown in FIG. 1 and thus through said apertured disk lens 16. While the electron beam is scanned, opposite DC voltage potentials identified with 101 and 102 are applied to the two opposite plates 33 and 34, that is at the two opposite interdigital structures 51, causing a transversely oriented electrical deflection field to act on the electron beam. Reference numerals 103 and 104 identify impulses of opposite polarity in the form of sinusoidal semi waves, which are the mentioned deflection or key-in signals with opposite signs. The broken lines 105 and 106 identify two potential values which indicate the threshold for the electron beam key-in operation. The broken vertical lines 107 and 108 include the time range of the electron beam key-in operation having for example a length of 350 psec ($350 \times 10^{-12}$ sec.). FIG. 3 shows that over considerable portions of time during the keying in of the electron beam a transverse field still acts on the electrons. However, according to the invention, during this time no longitudinal field acts which—as the inventor recognized led to the defects in corresponding devices known from the state of the art.

For the sake of completion it should be pointed out that for the keying in of the electron beam an apertured disk lens identified by 16 is not necessary in all cases. The electron beam current present during the time of the electron beam also can be deflected on the plates of the deflection installation (out of the beam axis) instead of on a diaphragm 16, for, like in the corresponding devices according to prior art, the apparatus according to the invention likewise contemplates that the opposite plates 33 and 34 and/or the opposite interdigital structures 51 are spaced apart only a small distance, and that just enough interstice remains between them so that the electron beam can pass without impediment (under the keying-in of the electron beam).

In addition to the solution of the problem as mentioned above it is possible with an apparatus according to the invention for the keying-in of electron beams to carry out an extremely short-timed beam impulse scanning with repeatably accurate start and finish of the impulses. According to an improvement of the invention, impulses with steep flanks but not necessarily short impulse width are applied to the two deflection parts of a deflection system and are arranged symmetrically to the beam axis. The impulse applied to the one deflection part, however, is so shifted in time relative to the other impulse applied to the opposite deflection part that only a slight overlapping in time of both impulses is present (as viewed in a time diagram such as that shown in FIG. 4, for example).

Figure 4:
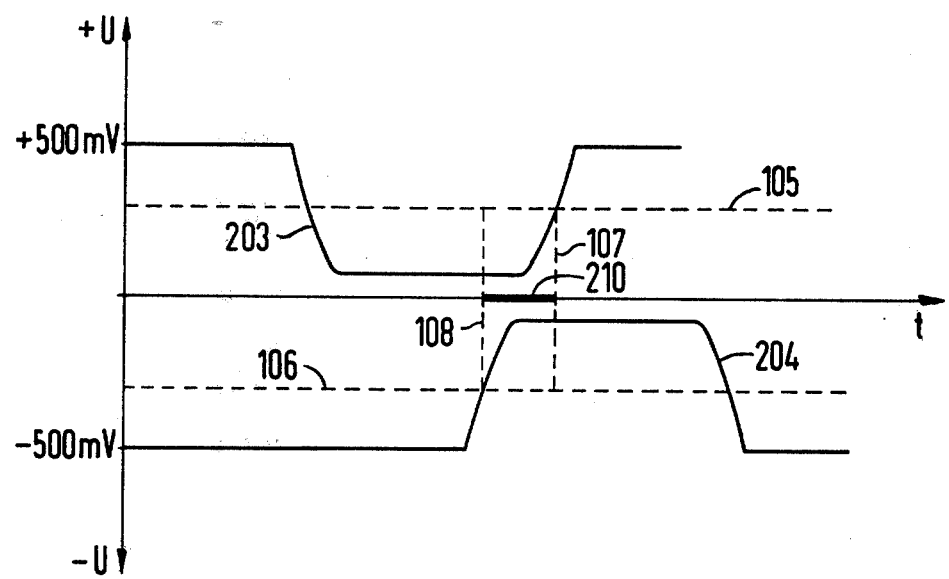
FIGS. 4 and 5 show an example for the generation of impulses.
Figure 5:
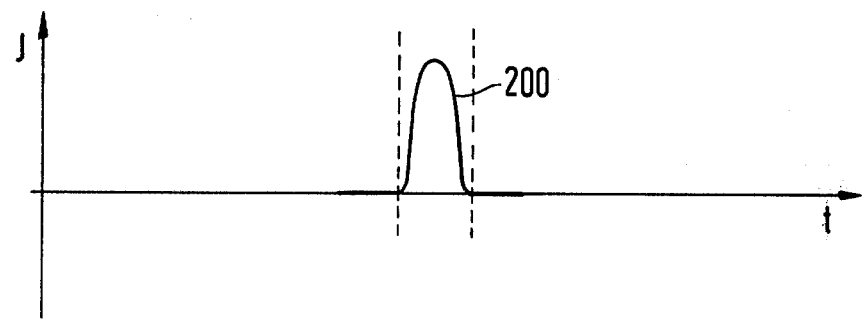

FIGS. 4 and 5 show the above mentioned conditions in an easily understandable form. Generally the details of the presentation in FIG. 4 agree with those in FIG. 3. However, the impulses 203 and 204 applied to the deflection parts 33, 34 opposite each other in each case are, as can be seen, shifted in time. Only a relatively short interval in time as indicated at 210 exists, during which both impulses 203 and 204 have such a difference in potential with respect to each other that the beam 15 passes the installation without beam deflection, that is it passes the diaphragm 16 without defocusing and axially. During this interval in time the relatively short beam impulse 200 shown in FIG. 5 occurs. Its flanks are a function both of the flanks of the impulses 203 and 204 and the timing control sensitivity of the installation according to the invention. Advantageously no comparable short impulses are necessary for a short impulse width, but impulses of comparatively substantially greater width, as represented, suffice. Such impulses can be generated, however, in a simple manner.

However, if the short impulses comparable with FIG. 3 are applied to the deflection parts, with a controlled time offset according to FIG. 4, a correspondingly extremely short impulse results.

For further details of FIG. 4 reference is made to the description relative to FIG. 3.

It will be apparent that many modifications and variations may be effected without departing from the scope of the novel concepts and teachings of the present invention.

I claim as my invention:

1. Apparatus for the keying in of electron beams for an electron beam system appropriate for a raster electron scan microscope, an electron beam recording apparatus and the like, comprising a deflection system for the deflection of the electron beam controllable in time for deflecting the beam out of its contemplated beam axis for beam scanning, the deflection system exhibiting a velocity modulating effect adapted to the beam velocity, characterized by the fact that the deflection system comprises a deflection installation (31, 32) having parts (33, 34, 51) symmetrical in relation to each other as related to the beam axis (15) at which the deflection signals are to be applied with opposite signs in each case, so that even with beam deflection a uniform axial potential remains.

2. The apparatus as defined in claim 1, with an apertured disk lens (16) arranged in the beam axis.

3. The operation of an apparatus for keying in electron beams as defined in claim 1, characterized by the fact that for a short-time keying in of electron beams with the use of comparatively broad impulses, impulses shifted in time in relation to each other are applied to the deflection installation which overlap in time only slightly (FIG. 4).

* * * * *